United States Patent [19]

Moyer et al.

[11] Patent Number: 5,650,973
[45] Date of Patent: Jul. 22, 1997

[54] PCMCIA POWER MULTIPLEXER INTEGRATED CIRCUIT WITH PROGRAMMABLE DECODE

[75] Inventors: James C. Moyer; Lawrence R. Sample; Robert P. Wolbert, all of San Jose, Calif.

[73] Assignee: Micrel, Inc., San Jose, Calif.

[21] Appl. No.: 313,640

[22] Filed: Sep. 27, 1994

[51] Int. Cl.[6] ............................................. G11C 13/00
[52] U.S. Cl. ..................... 365/226; 365/189.09; 365/212
[58] Field of Search ........................... 365/226, 189.09, 365/211, 212, 227, 229; 395/750; 327/512; 235/492; 364/483

[56] References Cited

U.S. PATENT DOCUMENTS

| | | | |
|---|---|---|---|
| 4,669,066 | 5/1987 | Kagawa et al. | 365/229 |
| 4,754,160 | 6/1988 | Ely | 365/229 X |
| 4,785,166 | 11/1988 | Kushima | 235/492 |
| 5,197,033 | 3/1993 | Watanabe et al. | 365/226 |
| 5,300,765 | 4/1994 | Mizuta | 365/226 X |
| 5,331,599 | 7/1994 | Yero | 365/226 |

OTHER PUBLICATIONS

F. Goodenough, "Host CPU's IC Managers Power For PCMCIA Cards", Electronic Design magazine, Sep. 5, 1994, pp. 47–52.

Primary Examiner—Joseph A. Popek
Attorney, Agent, or Firm—Skjerven, Morrill, MacPherson, Franklin and Friel; T. Lester Wallace

[57] ABSTRACT

A digital value on a plurality of control input terminals of a PCMCIA power multiplexer integrated circuit determines which one if any of a plurality of power input terminals (for example, 12 volts, 5 volts, and 3 volts) is coupled through the integrated circuit to a power output terminal. A decoder which decodes the digital value prevents any two of the power input terminals from being coupled to the power output terminal at the same time. The decoder is programmable so that a single power multiplexer integrated circuit die layout can support a variety of PCMCIA controllers outputting different digital values. The integrated circuit has current limit, controlled power turn on times, and overtemperature protection. A signal indicative of a fault condition (for example, an overtemperature or a current limit condition) is output onto a fault output terminal of the integrated circuit.

23 Claims, 10 Drawing Sheets

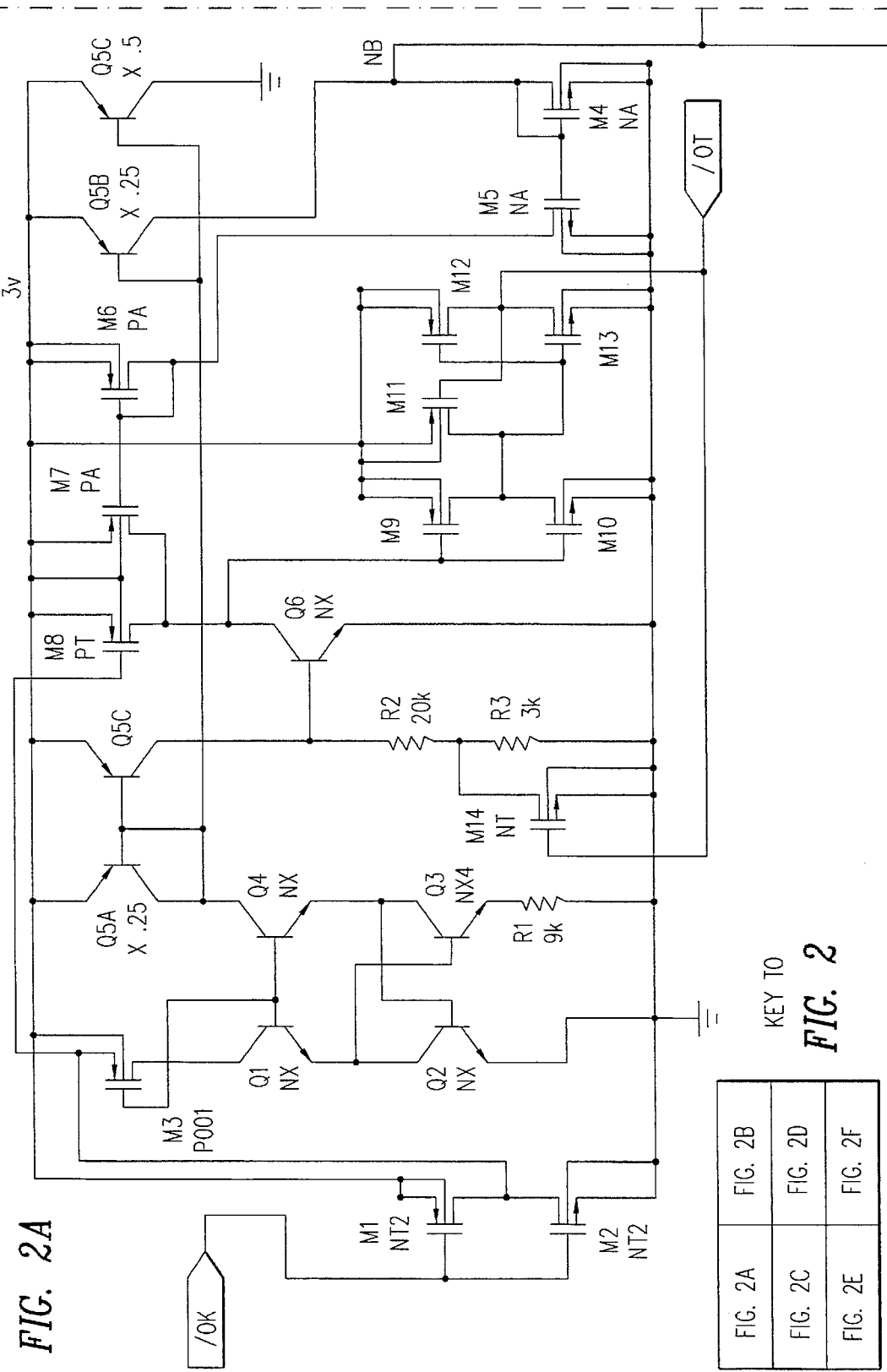

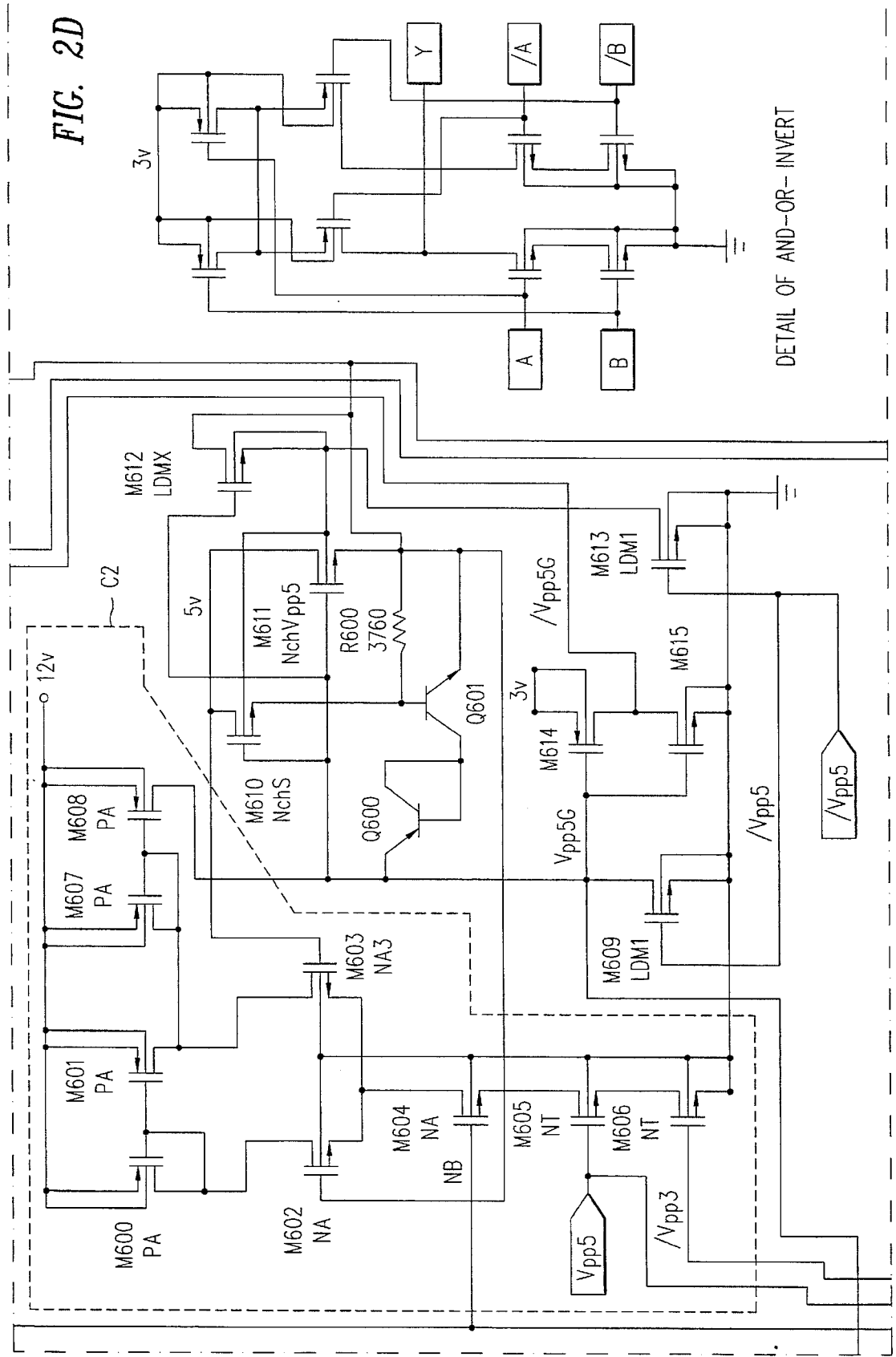

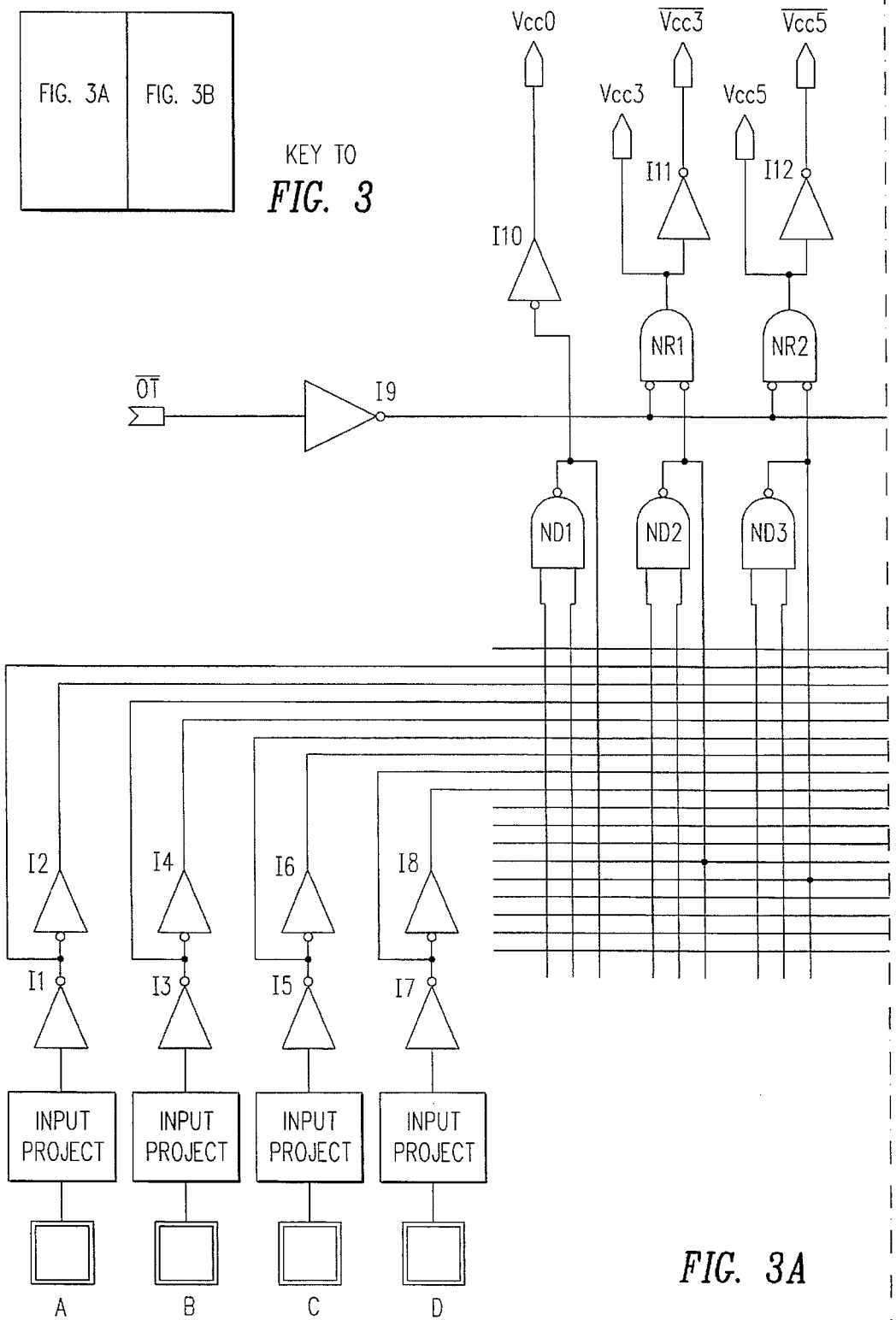

PCMCIA POWER MULTIPLEXER INTEGRATED CIRCUIT WITH PROGRAMMABLE DECODE

FIELD OF THE INVENTION

This invention relates to PCMCIA power multiplexer circuits.

BACKGROUND INFORMATION

The Personal Computer Memory Card International Association (PCMCIA) standard is a well-known standard which defines a small credit card sized card, a small thin connector on the short edge of the card, and an associated electrical interface for coupling the card to another device (for example, a personal computer) via the connector. If, for example, a PCMCIA card is inserted into an accommodating slot in a personal computer such that the PCMCIA connector of the PCMCIA card mates with a corresponding PCMCIA connector of the personal computer, then the personal computer supplies power in a specified manner to power terminals of the PCMCIA connector of the personal computer so that electronics on a PCMCIA card coupled to the personal computer can be powered from the personal computer. The PCMCIA interface therefore provides a physical and electrical interface by which small intelligent devices realized on PCMCIA cards can be easily inserted and removed from personal computers.

There are two PCMCIA connector power terminals which are of particular interest. One is driven by the personal computer with a supply voltage of either 12, 5 or 3 volts. The other is driven by the personal computer with a supply voltage of either 5 or 3 volts. The particular voltage driven is determined by the PCMCIA specification. A device realized on a PCMCIA card may instruct circuitry inside a personal computer via the PCMCIA interface to drive the power terminals of the PCMCIA interface with particular voltages needed by the card. Typically, a controller integrated circuit inside the personal computer interfaces through the PCMCIA connector to the PCMCIA card, determines which voltages should be driven onto which power terminals, and then outputs a digital value to control a power multiplexer integrated circuit inside the personal computer. The power multiplexer integrated circuit then couples the appropriate voltage to the appropriate power terminal of the PCMCIA connector. There are many such controller integrated circuits available today. Controllers are available, for example, from Intel, Texas Instruments, Cirrus Logic and Data Book. Accordingly, a power multiplexer integrated circuit for multiplexing different voltages onto the appropriate PCMCIA power terminals is desired which will work with all of these controllers.

SUMMARY

A digital value on a plurality of control input terminals of a power multiplexer integrated circuit determines which one if any of a plurality of power input terminals (for example, 12 volts, 5 volts, and 3 volts) is coupled through the integrated circuit to a power output terminal. The decoder of the integrated circuit which decodes the digital value is programmable so that a single power multiplexer integrated circuit die layout can support a variety of PCMCIA controllers outputting different digital values. The power supplied by the integrated circuit is current limited, the integrated circuit slowly turns on the power to the appropriate power terminals, and the integrated circuit is protected from overtemperature conditions. The decoder prevents two of the power input terminals from being simultaneously coupled to the same power output terminal. A signal indicative of a fault condition (for example, an overtemperature condition or a current limit condition) is output onto a fault output terminal of the integrated circuit.

DETAILED DESCRIPTION OF THE PREFERRED EMBODIMENTS

Figure 1:
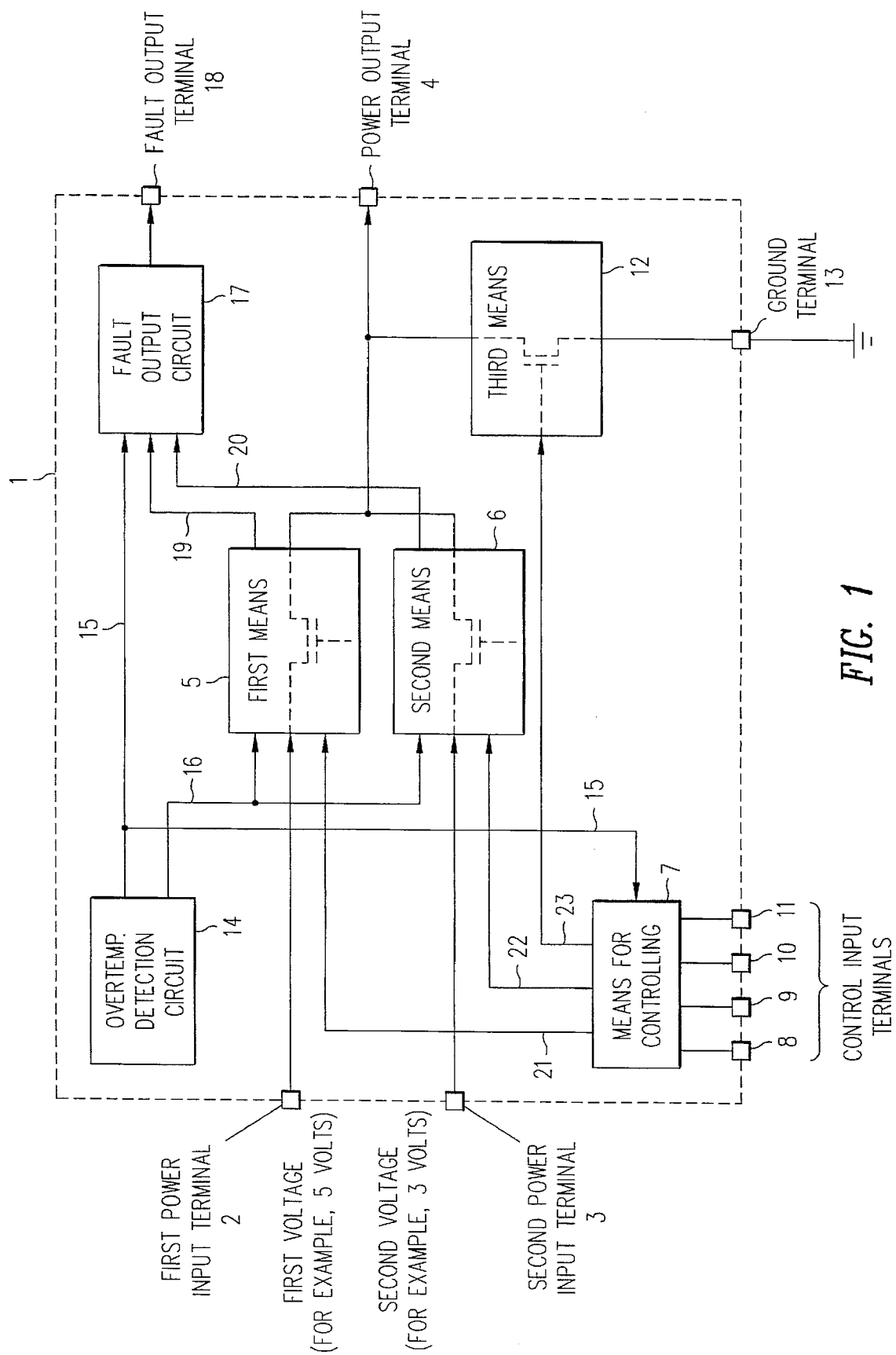
FIG. 1 is a block diagram in accordance with an embodiment of the present invention.
Figure 2B:
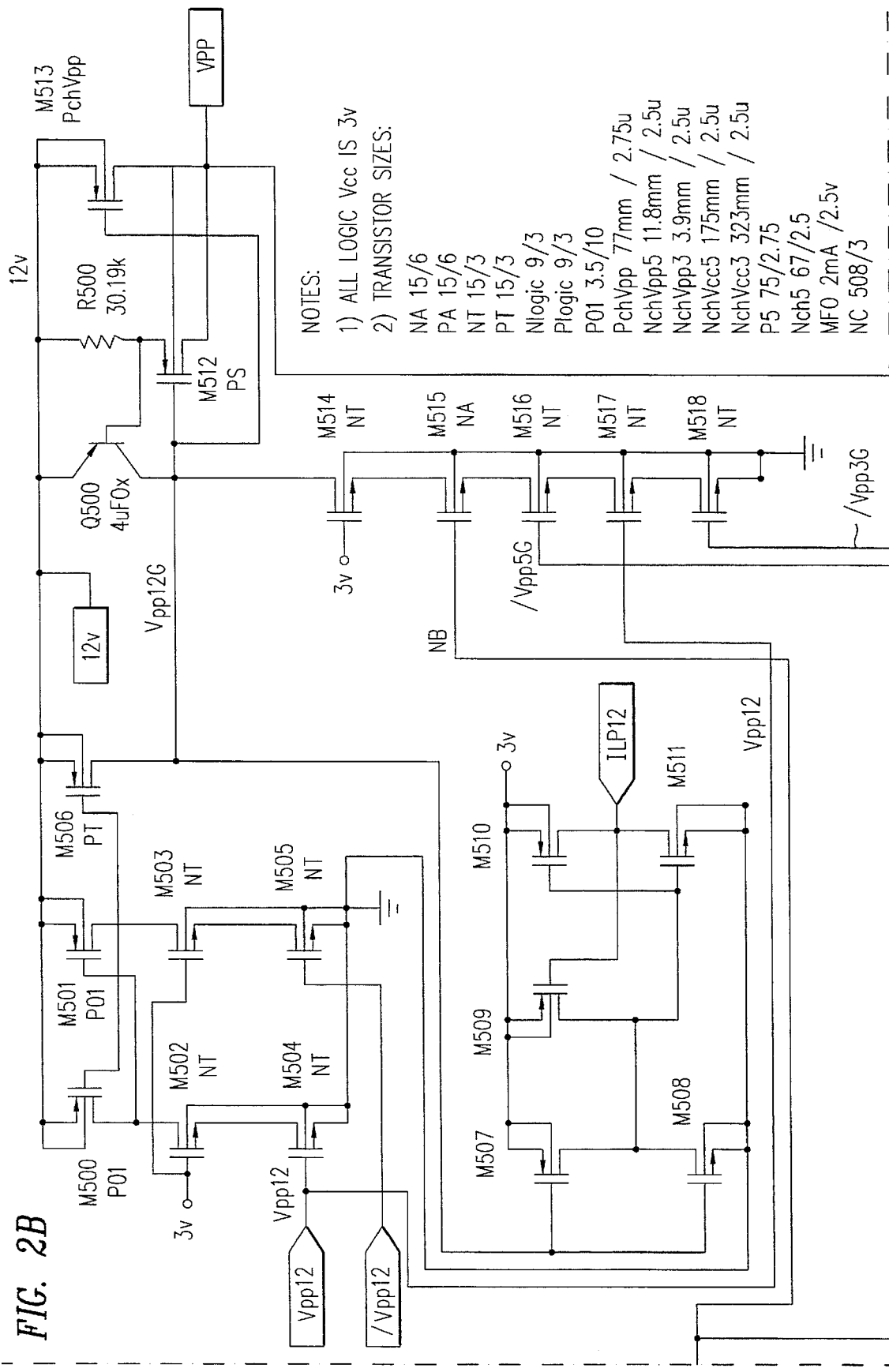
FIGS. 2–4 are a circuit diagram of a power multiplexer integrated circuit in accordance with an embodiment of the present invention.
Figure 2C:
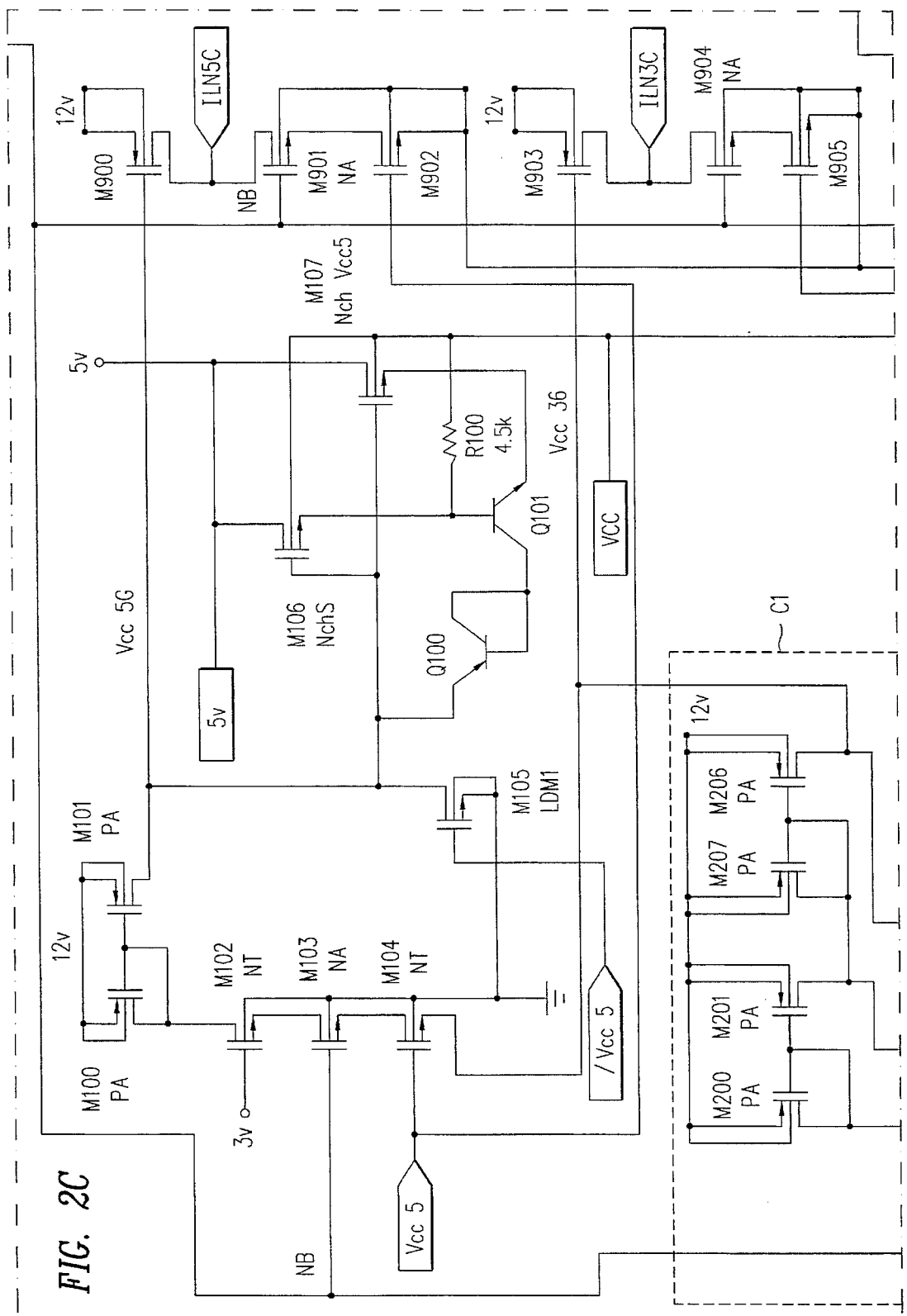
Figure 2E:
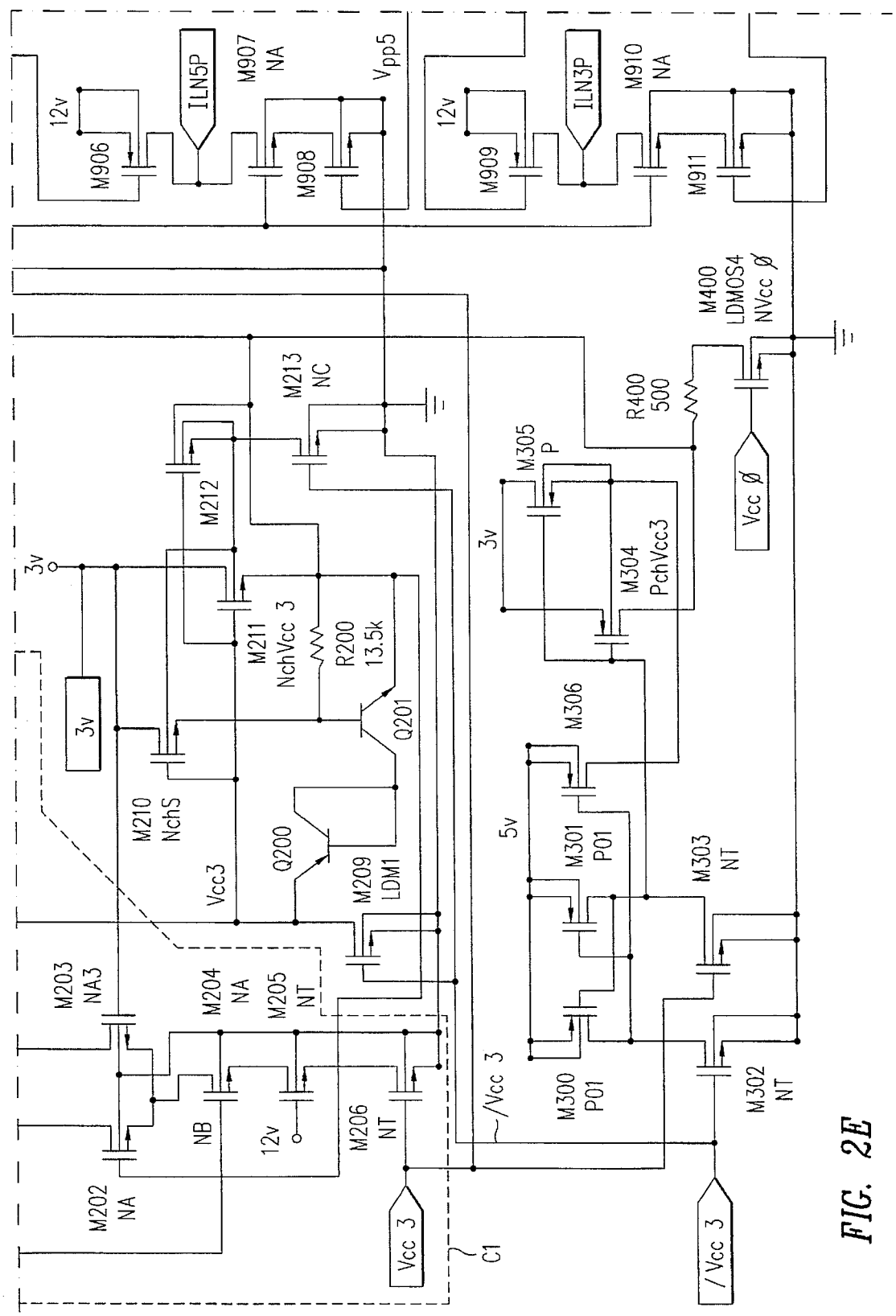
Figure 2F:
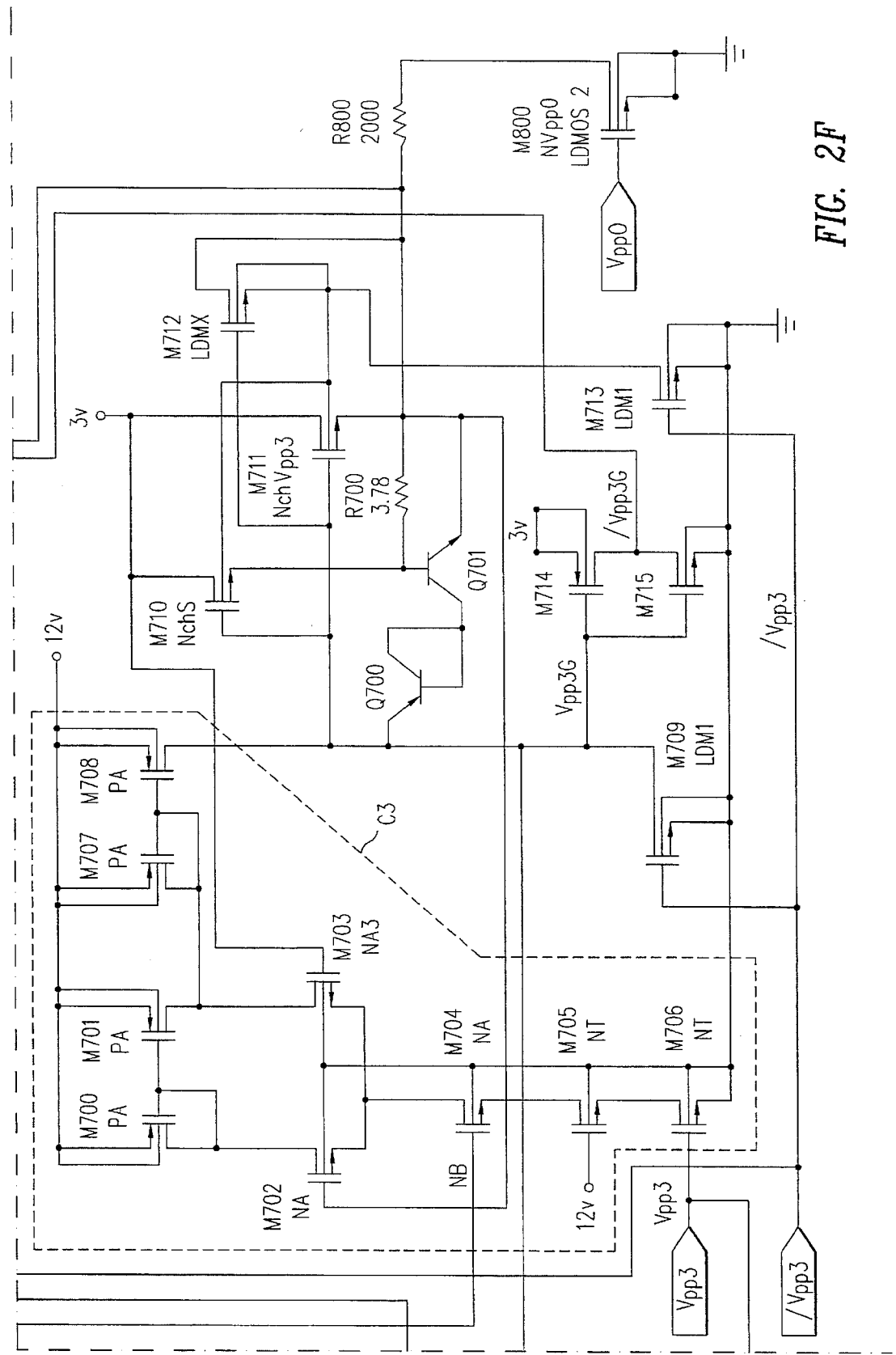

FIG. 1 is a block diagram of a PCMCIA power multiplexer integrated circuit 1 comprising a first power input terminal 2, a second power input terminal 3 and an power output terminal 4. A first means 5 for supplying power to the power output terminal controllably couples or decouples first power input terminal 2 to the power output terminal 4. A second means 6 for supplying power to the power output terminal controllably couples or decouples second power input terminal 3 to the power output terminal 4. A means for controlling 7 the first and second means decodes a digital value received on a plurality of control input terminals 8–11 to determine which one if either of the first and second means should be enabled to couple an input voltage to the output terminal. At most one of the first and second means is enabled at a given time. In the event that neither of the first and second means is enabled, then a third means 12 for coupling the power output terminal to ground may be controlled by the means for controlling 7 so that the power output terminal 4 is coupled to a ground terminal 13. The transistors illustrated in dashed lines inside the blocks of FIG. 1 are presented merely to illustrate the power switching function of the blocks and do not necessarily represent the circuitry inside the blocks.

An overtemperature detection circuit 14 detects overtemperature conditions. The overtemperature detection circuit may be coupled via a conductor 15 to the means for controlling 7 so that the means for controlling can disable both the first and second means 5 and 6 in an overtemperature condition. The overtemperature detection circuit 14 may also be coupled to both the first and second means by conductor 16 to disable the first and second means 5 and 6.

A fault output circuit 17 supplies a fault signal onto fault output terminal 18. The fault signal is indicative of a fault condition such as a current limit condition and/or an overtemperature condition. In the embodiment shown in FIG. 1, fault output circuit 17 receives a signal indicative of an overtemperature condition from overtemperature detection circuit 14 via conductor 15. Moreover, each of the first and second means 5 and 6 includes a current limit circuit which prevents the current passing through the respective means from exceeding a predetermined amount. In the event the current limit is reached, the current limit circuit outputs a signal indicative of the current limit condition via a conductor 19, 20 to the fault output circuit 17. Accordingly, the signal on fault output terminal 18 is indicative of an overtemperature condition, a current limit condition in the first means 5, and a current limit condition in the second means 6.

To prevent both the first means 5 and the second means 6 from simultaneously coupling their respective power input terminals 2 and 3 to the output terminal 4 at the same time and shorting two external voltage sources together through the integrated circuit 1, the means for controlling 7 generates signals onto control conductors 21-23 such that only one of the first, second and third means is enabled at a time. To prevent the first and second means from too quickly coupling voltage sources to the output terminal and thereby causing unwanted voltage transients, the first and second means may contain switches which turn on relatively slowly to slowly couple the external voltage sources to the output terminal.

There are multiple different controller integrated circuits which generate the digital values to control PCMCIA power multiplexing. Different digital values are output by the different controllers to denote coupling of the same power voltage source to the same PCMCIA terminal. To enable one PCMCIA power multiplexer integrated circuit die layout to be usable with all of these multiple different controllers, the means for controlling 7 comprises a programmable decoder. ROM, PLA or PAL techniques can be used including antifuse structures.

Figure 3B:
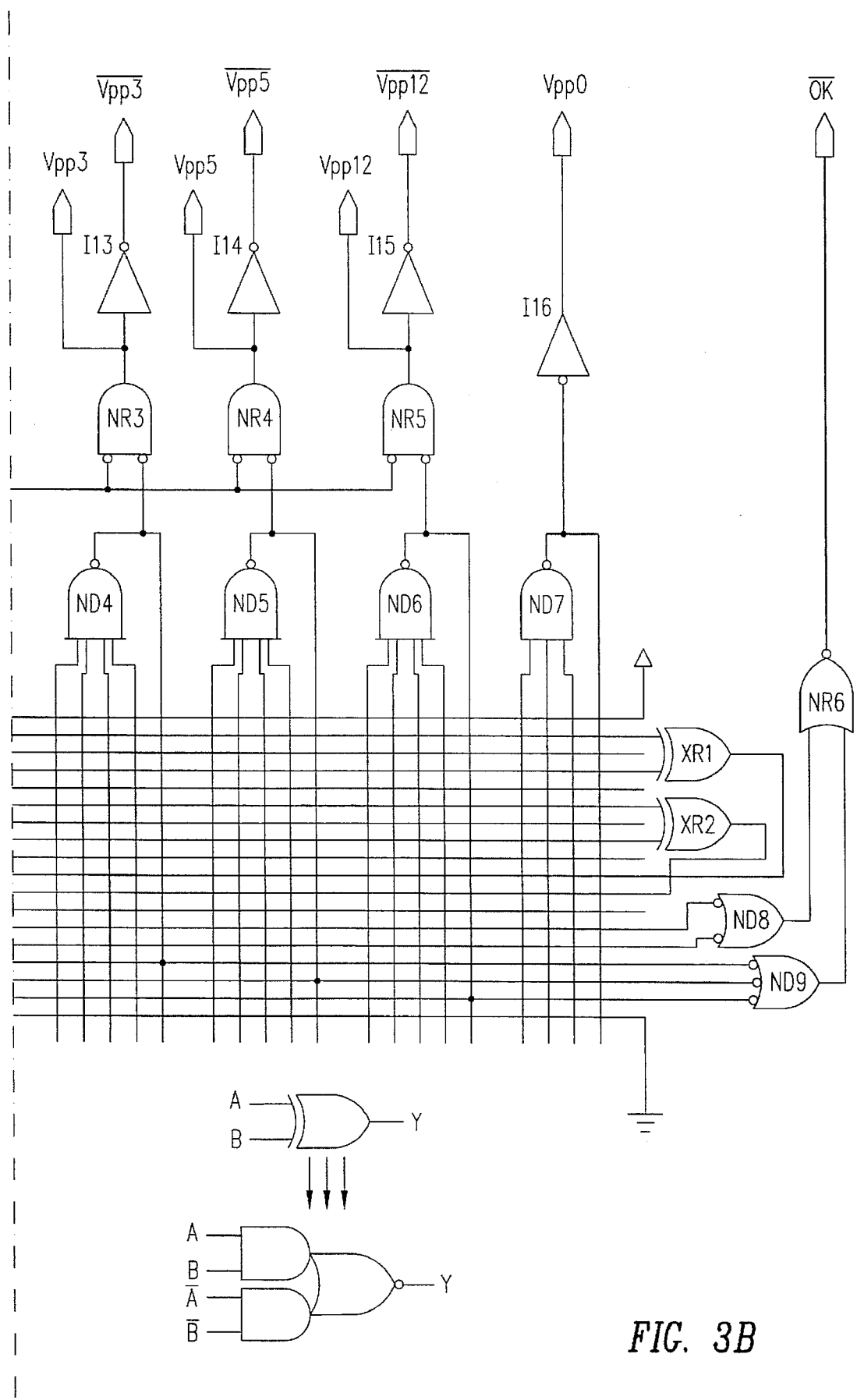
Figure 4:
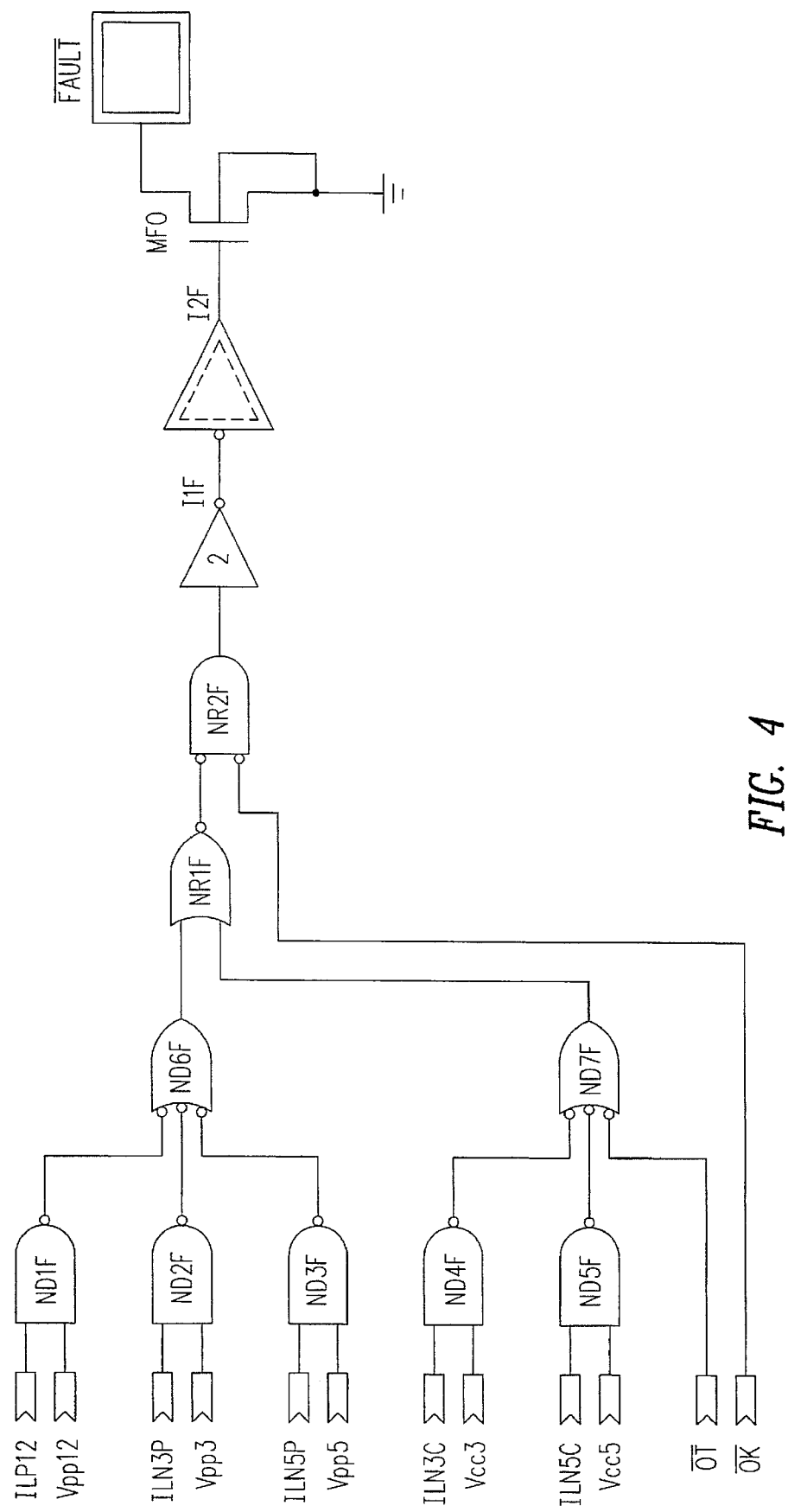

FIGS. 2-4 are a circuit diagram of a power multiplexer integrated circuit in accordance with a specific embodiment of the present invention. The circuitry of FIG. 3 corresponds with the means for controlling 7 of FIG. 1. The node labeled OT in FIG. 3 couples to the node labeled /OT in FIG. 2. This conductor corresponds with conductor 15 in FIG. 1. The four terminals labeled A-D in FIG. 3 correspond with the terminals 8-11 in FIG. 1. The perpendicularly intersecting matrix of conductors with selected interconnection dots in FIG. 3 are a mask programmable matrix of polysilicon and metal conductors.

The circuitry in the upper left portion of FIG. 2 corresponds with the overtemperature detection circuit 14 of FIG. 1. The overtemperature detection circuit is a current source which supplies a current onto the conductor labeled NB in FIG. 2 until a thermal shutdown temperature is reached. When the thermal shutdown temperature is reached, the current source is disabled. The thermal shutdown temperature at which transistor Q6 turns on and disables a current source output is set by driving the base of bipolar transistor Q6 with a voltage having a positive temperature coefficient. In an overtemperature condition, the conductor labeled /OT in FIG. 2 is driven low by the overtemperature detection circuit. The overtemperature detection circuit of FIG. 2 is further described in the copending application entitled "Thermal Shutdown Circuit", Ser. No. 08/313,480, filed in the name of James C. Moyer, the subject matter of which is incorporated herein by reference.

The boxes labeled "5 V", "3 V" and "VCC" in FIG. 2 correspond with the first power input terminal 2, the second power input terminal 3 and the power output terminal 4 of FIG. 1, respectively. Transistor M107 is controllable to couple the 5 V power input terminal to the VCC power output terminal and corresponds with circuitry of the first means 5 of FIG. 1. Transistor M211 is controllable to couple the 3 V power input terminal to the VCC power output terminal and corresponds with circuitry of the second means 6 of FIG. 1. Transistor M400 is controllable to couple the VCC power output terminal to ground and corresponds with the third means 12 of FIG. 1.

Not only does the integrated circuit of FIGS. 2-4 include a first power multiplexer for multiplexing 5 or 3 volts onto the VCC power output terminal, but the integrated circuit of FIGS. 2-4 also includes a second power multiplexer for multiplexing 12, 5 or 3 volts onto a second power output terminal denoted with a box labeled "VPP" in FIG. 2. Transistors M513 (a P channel FET), M511 and M711 (N channel FETs) are controllable to couple 12, 5 or 3 volts onto power output terminal VPP, respectively. Transistor M800 (which corresponds with transistor M400) is controllable to couple power output terminal VPP to ground in the event that none of transistors M513, M511 and M711 are controlled to be conductive.

The various power switches of FIG. 2 can be turned on by the circuitry of FIG. 3. If switch M107, for example is to be turned on to supply 5 volt power onto output terminal VCC, then a digital high is driven onto the conductor labeled Vcc5 in FIG. 2 and a digital low is driven onto the conductor labeled Vcc5 in FIG. 2. The other power switches of FIG. 2 are controlled in a similar fashion by other of the outputs of FIG. 3. Conductor Vcc5 of FIG. 2 corresponds with conductor 21 of FIG. 1. Conductor Vcc3 of FIG. 2 corresponds with conductor 22 of FIG. 1. Conductor Vcc0 of FIG. 2 corresponds with conductor 23 of FIG. 1.

Each of the power switches is controlled to turn on slowly. The current flowing through transistor M4 of the overtemperature detection circuit is mirrored with the current flowing through transistors M103, M204, M515, M604, and M704. These mirrored currents in transistors M103, M204, M515, M604 and M704 are used to charge the gates of the corresponding switches M107, M211, M513, M511 and M711. The magnitude of the charging currents and the magnitudes of the gate capacitances are selected to so that appropriate turn on times are realized. The larger switches M107 and M211 have longer turn on times. The turn on time for switch M107 is greater than 250 microseconds and the turn on time for switch M211 is 350 microseconds. The turn on times of the smaller switches M513, M511 and M711 are greater than 100 microseconds. In some embodiments, capacitance in addition to the gate capacitance of the small switch is added to realize the desired turn on time.

The current supplied from each of the switches is current limited. For example, a fraction of the current flowing through main switch M107 is made to pass through current sense resistor R100. If too much current flows through switch M107, then enough current flows through current sense resistor R100 that the base-emitter junction of transistor Q101 is forward biased. Transistor Q101 then limits current flow through switch M107 by coupling the source and gate of switch M107 together via diode connected transistor Q100. When switch M107 is in current limit, the low voltage on the gate of switch M107 turns P-channel transistor M900 on thereby indicating a current limit condition by pulling the voltage on the conductor labeled ILN5C in FIG. 2 high. The mirrored current source comprising transistors M901 and M902 is turned on when switch M107 is on. Therefore, if switch M107 is on but is not in current limit, then transistors M901 an M902 are on and transistor M900 is off. The voltage on the ILN5C conductor is therefore driven low indicating no current limit condition. Conductor ILN5C of FIG. 2 corresponds with conductor 19 of FIG. 1. Conductor ILN3C corresponds with conductor 20 of FIG. 1.

FIG. 4 corresponds with the fault output circuit 17 of FIG. 1. If for example, switch M107 is in current limit, then a digital high is present on conductor ILN5C. If switch M107 is enabled by the means for controlling, then enable signal Vcc5 will be a digital high. Accordingly, the output of the gate ND5F in FIG. 4 will be low, the output of gate ND7F will be high, and the output of NOR gate NR1F will be low. The signal OK from the means for controlling of FIG. 3 will be low indicating that a switch is enabled. Accordingly, the output of gate NR2F will be high, the output of inverter I1F will be low, the output of inverter I2F will be high, transistor MF0 will be on, and the fault signal on the fault output terminal will be a digital low indicating a current limit condition.

In an overtemperature condition, signal $\overline{OT}$ will be low, the output of gate ND7F will be high, and the output of gate NR1F will be low. In the event that a power switch is enabled, signal $\overline{OK}$ will be low. The output of gate NR2F will therefore be high, the output of inverter I1F will be low, the output of inverter I2F will be high, transistor MF0 will be on, and the fault signal output on the fault output terminal will be low indicating an overtemperature condition.

Additionally, there are in the circuit of FIG. 2 comparators which monitor the output voltage and ensure that it is lower than the input voltage of the switch to be turned on. The comparators are surrounded by dashed boxes and are labeled C1–C3. In some embodiments, the gate voltage of the switch is monitored rather than the output voltage.

Although the present invention has been described in connection with certain exemplary embodiments, the present invention is not limited thereto. The voltages set forth in the above description, which are coupled to the output terminals, are presented only as representative voltages. Other voltages may be used. The method of controlling switch turn on time using a mirrored overtemperature detection current source is but one way of controlling switch turn on time. Other techniques may be employed. It is to be understood, therefore, that various changes, modifications, and combinations of features of the described embodiments may be practiced without departing from the scope of the invention as set forth in the appended claims.

We claim:

1. An integrated circuit, comprising:
   first means for supplying power to a PCMCIA connector by coupling a first power input terminal of said integrated circuit to a power output terminal of said integrated circuit;
   second means for supplying power to a PCMCIA connector by coupling a second power input terminal of said integrated circuit to said power output terminal of said integrated circuit; and
   means for controlling said first and second means such that at most one of said first and said second power input terminals is coupled to said power output terminal at a time, wherein either of said first and second power input terminals can be selectively coupled to said power output terminal even if a voltage of at least 3 volts is present on said first power input terminal when a voltage of at least 3 volts is present on said second power input terminal.

2. The integrated circuit of claim 1, wherein said first power input terminal is a terminal supplied with a voltage of approximately 5 volts and wherein said second power input terminal is supplied with a voltage of approximately 3 volts.

3. An integrated circuit, comprising:
   first means for supplying power to a PCMCIA connector by coupling a first power input terminal of said integrated circuit to a power output terminal of said integrated circuit;
   second means for supplying power to a PCMCIA connector by coupling a second power input terminal of said integrated circuit to said power output terminal of said integrated circuit; and
   means for controlling said first and second means such that at most one of said first and said second power input terminals is coupled to said power output terminal at a time,
   wherein said integrated circuit comprises a first control input terminal and a second control input terminal, said means for controlling decoding a digital value on at least said first and second control input terminals to determine which of said first and second power input terminals to couple to said power output terminal.

4. The integrated circuit of claim 3, wherein said integrated circuit comprises a third control input terminal and a fourth control input terminal, said digital value being a four bit digital value present on said first, second, third and fourth control input terminals.

5. The integrated circuit of claim 3, wherein said integrated circuit comprises a fault output terminal, said integrated circuit further comprising:
   means for supplying a signal onto said fault output terminal which is indicative of a current limit condition of a switch on said integrated circuit.

6. The integrated circuit of claim 3, wherein said integrated circuit comprises a fault output terminal, said integrated circuit further comprising:
   means for supplying a signal onto said fault output terminal which is indicative of an overtemperature condition on said integrated circuit.

7. The integrated circuit of claim 3, wherein said means for controlling comprises a programmable decoder.

8. The integrated circuit of claim 7, wherein said programmable decoder is mask programmable.

9. The integrated circuit of claim 7, wherein said programmable decoder can be programmed in one way to decode a digital value to couple said first power input terminal to said power output terminal and wherein said programmable decoder can be programmed in a second way to decode said digital value to couple said second power input terminal to said power output terminal.

10. An integrated circuit, comprising:
    first means for supplying power to a PCMCIA connector by coupling a first power lead to a power output terminal of said integrated circuit, said first power lead being directly coupled to a first power input terminal of said integrated circuit;
    second means for supplying power to a PCMCIA connector by coupling a second power lead to said power output terminal of said integrated circuit, said second power lead being directly coupled to a second power input terminal of said integrated circuit;
    third means for coupling said power output terminal to ground; and
    means for controlling said first and second means such that at most one of said first power lead and said second power lead is coupled to said power output terminal at a time, wherein said means for controlling controls said third means for coupling to couple said power output terminal to ground if neither said first or second power leads is coupled to said power output terminal.

11. An integrated circuit, comprising:
    first means for supplying power to a PCMCIA connector by coupling a first power lead to a power output terminal of said integrated circuit, said first power lead being directly coupled to a first power input terminal of said integrated circuit;
    second means for supplying power to a PCMCIA connector by coupling a second power lead to said power output terminal of said integrated circuit, said second power lead being directly coupled to a second power input terminal of said integrated circuit; and
    means for controlling said first and second means such that at most one of said first power lead and said second power lead is coupled to said power output terminal at a time, wherein said first means comprises:
  a field effect transistor having a source, a drain and a gate, said source being coupled to said power output terminal, said drain being coupled to said first power lead;
  a resistor having a first lead and a second lead, said first lead being coupled to said source; and
  a bipolar transistor having an emitter, a base and a collector, said emitter being coupled to said source, said base being coupled to said second lead of said resistor, said collector being coupled to said gate.

12. The integrated circuit of claim 11, wherein said collector of said bipolar transistor is coupled to said gate of said field effect transistor via a diode-connected bipolar transistor.

13. An integrated circuit, comprising:
  first means for supplying power to a PCMCIA connector by coupling a first power lead to a power output terminal of said integrated circuit, said first power lead being directly coupled to a first power input terminal of said integrated circuit;
  second means for supplying power to a PCMCIA connector by coupling a second power lead to said power output terminal of said integrated circuit, said second power lead being directly coupled to a second power input terminal of said integrated circuit; and
  means for controlling said first and second means such that at most one of said first power lead and said second power lead is coupled to said power output terminal at a time, wherein said first means comprises:
    a field effect transistor having a source, a drain and a gate, said source being coupled to said first power lead, said drain being coupled to said power output terminal;
    a resistor having a first lead and a second lead, said first lead being coupled to said source; and
    a bipolar transistor having an emitter, a base and a collector, said emitter being coupled to said source, said base being coupled to said second lead of said resistor, said collector being coupled to said gate.

14. An integrated circuit, comprising:
  first means for supplying power to a PCMCIA connector by coupling a first power lead to a power output terminal of said integrated circuit, said first power lead being directly coupled to a first power input terminal of said integrated circuit;
  second means for supplying power to a PCMCIA connector by coupling a second power lead to said power output terminal of said integrated circuit, said second power lead being directly coupled to a second power input terminal of said integrated circuit;
  means for controlling said first and second means such that at most one of said first power lead and said second power lead is coupled to said power output terminal at a time; and
  a current mirror having a first current path and a second current path, a first current flowing in said first current path mirroring a second current flowing in said second current path, said first current charging a gate of a transistor of said first means for supplying power to a PCMCIA card, said transistor of said first means being coupled to both said first power lead and to said power output terminal.

15. The integrated circuit of claim 14, wherein said gate of said transistor of said first means is charged to have a gate voltage rise time of at least 200 microseconds.

16. The integrated circuit of claim 14, further comprising:
  an overtemperature protection circuit, said second current path being a current path in said overtemperature protection circuit, a flow of said second current in said second current path being stopped by said overtemperature protection circuit in an overtemperature condition.

17. A method, comprising:
  decoding a digital value received on a plurality of control terminals of an integrated circuit with a programmable decoder of said integrated circuit; and
  coupling at most one of a first power input terminal and a second power input terminal to a power output terminal, said first power input terminal, said second power input terminal and said power output terminal being terminals of said integrated circuit.

18. The method of claim 17, further comprising:
  providing an output signal on a fault output terminal of said integrated circuit, said output signal being indicative of a fault condition on said integrated circuit.

19. The method of claim 17, wherein said programmable decoder is user programmable.

20. The method of claim 17, wherein said programmable decoder is mask programmable.

21. The method of claim 17, wherein said fault condition is an overtemperature condition.

22. The method of claim 17, wherein said fault condition is a current limit condition.

23. A method, comprising:
  decoding a digital value received on a plurality of control terminals of an integrated circuit with a programmable decoder of said integrated circuit; and
  coupling at most one of a first power input terminal and a second power input terminal to a power output terminal, said first power input terminal, said second power input terminal and said power output terminal being terminals of said integrated circuit, wherein said fault condition is a current limit condition; and
  coupling said power output terminal to a ground terminal of said integrated circuit if neither said first power input terminal or said second power input terminal is coupled to said power output terminal.

* * * * *